United States Patent [19]
Inukai

[11] Patent Number: 5,260,705
[45] Date of Patent: Nov. 9, 1993

[54] ANALOG-TO-DIGITAL CONVERTER HAVING SELECTIVELY AND INDEPENDENTLY CONTROLLABLE SAMPLING AND CONVERSION PERIODS

[75] Inventor: Keizo Inukai, Kasugai, Japan

[73] Assignees: Fujitsu Limited, Kawasaki; Fujitsu VLSI Limited, Kasugai, both of Japan

[21] Appl. No.: 854,087

[22] Filed: Mar. 19, 1992

[30] Foreign Application Priority Data

Mar. 19, 1991 [JP] Japan .................................. 3-054910

[51] Int. Cl.[5] .............................................. H03M 1/12
[52] U.S. Cl. ..................................... 341/155; 341/123
[58] Field of Search ............... 341/155, 156, 157, 166, 341/167, 168, 169, 170, 122, 123, 124, 125

[56] References Cited

U.S. PATENT DOCUMENTS

| | | | |
|---|---|---|---|
| 4,510,569 | 4/1985 | Takao et al. | 364/431.12 |
| 4,633,222 | 12/1986 | Dingwall | 340/347 SH |
| 4,677,554 | 6/1987 | Dobbs et al. | 364/413.15 |
| 5,128,676 | 7/1992 | Ordway | 341/167 |

FOREIGN PATENT DOCUMENTS 0474025  3/1992  European Pat. Off. .
87/03114  5/1987  World Int. Prop. O. .

OTHER PUBLICATIONS

"Analog to Digital Conversion Handbook", Analog Devices, Inc. 1986, pp. 559-572.

Primary Examiner—A. D. Pellinen
Assistant Examiner—Brian K. Young
Attorney, Agent, or Firm—Staas & Halsey

[57] ABSTRACT

An analog-to-digital (A/D) converter has a simple arrangement and achieves an accurate high-speed A/D converting operation. The A/D converter comprises an analog data input unit (2), an A/D conversion circuit (3), a controller (4) for controlling the A/D conversion circuit (3), and a digital data output unit (100). The controller (4) includes a sampling time controller (5) and a bit conversion time controller (6).

15 Claims, 14 Drawing Sheets

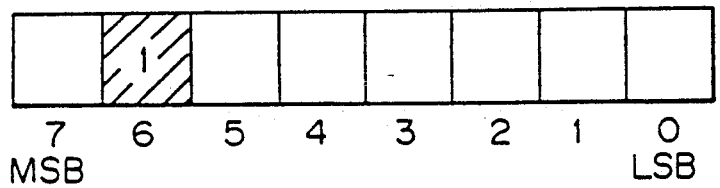
Fig.7(A) A/D CONTROL REGISTER
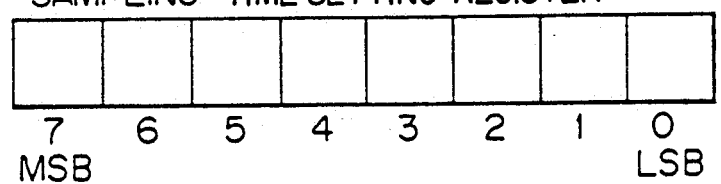
Fig.7(B) SAMPLING TIME SETTING REGISTER
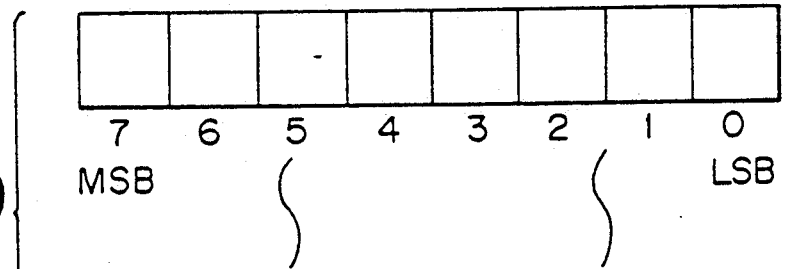
Fig.7(C) BIT CONVERSION TIME SETTING REGISTER (FOR BIT 7) ... CONVERSION CONTROL REGISTER (FOR BIT 0)

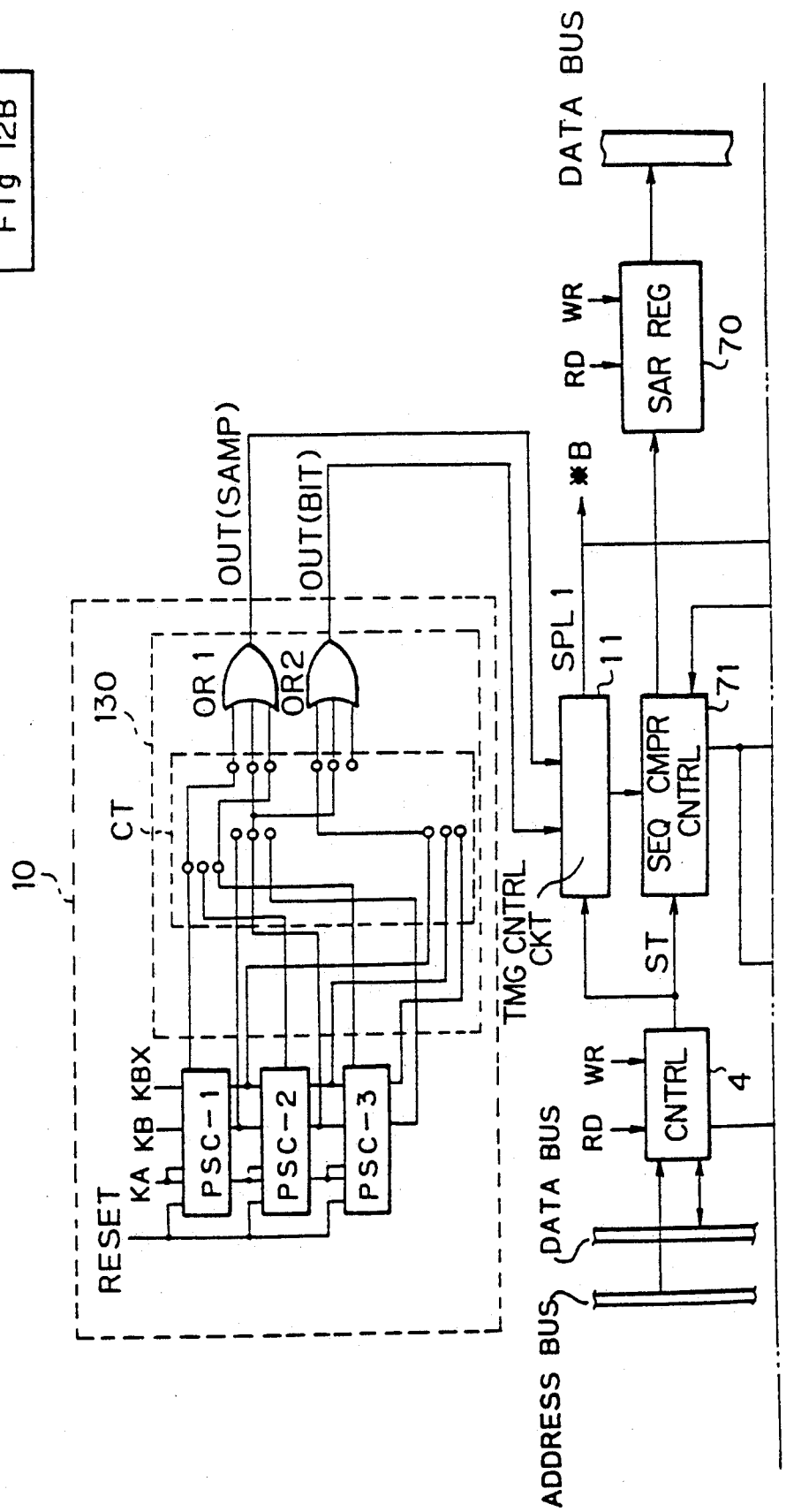

ANALOG-TO-DIGITAL CONVERTER HAVING SELECTIVELY AND INDEPENDENTLY CONTROLLABLE SAMPLING AND CONVERSION PERIODS

FIELD OF THE INVENTION

1. Field of the Invention

The present invention relates to an analog-to-digital converter, and particularly to a high-speed analog-to-digital converter.

2. Description of the Related Art

Analog-to-digital (hereinafter referred to as A/D) converters are important as an interface between analog values, that are ubiquitous physical quantities existing in the natural world, and digital values, that are physical quantities manipulated by computers. According to their conversion methods, A/D converters are classified into a flash type, a sequential comparison type, and an integration type.

Among these A/D converters, the sequential comparison A/D converters, which are usually incorporated in microcontrollers, have improved significantly in recent years. The sequential comparison A/D converters partly or entirely use a charge-redistribution system employing weighted capacitors to provide an accuracy of 10 bits and an A/D conversion time of about 10 μs at a reasonable cost. When the capacitance of the charge-redistribution system is increased to improve accuracy, however, input resistors thereof must bear a large load thereby deteriorating speed.

The sequential comparison A/D converters employing the charge-distribution system are usually designed to have a short sampling time to achieve a high-speed operation with reduced input resistance and capacitance. If the input resistance is too low, however, noise will occur, and if the capacitance is too low, accuracy will deteriorate. It is, therefore, difficult to simultaneously achieve a high speed and accuracy in the sequential comparison A/D converters.

Once an A/D converter is fabricated with a given sampling time and bit conversion time, it is impossible to change the specifications of the A/D converter to meet the user's different requirements of, for example, a slower bit conversion time and higher sampling accuracy, or a normal sampling accuracy and faster bit conversion time. Namely, to meet such requirements, the A/D converter must be again designed and fabricated according to the requirements. This may increase the cost.

Similarly, a 12-bit A/D converter cannot be used as an 8-bit A/D converter. If a user needs an 8-bit A/D converter, it must be designed and fabricated from the beginning.

SUMMARY OF THE INVENTION

To solve these problems, an object of the invention is to provide an accurate high-speed A/D converter having a simple structure and fabricated at a low cost.

Another object of the invention is to provide an efficient inexpensive A/D converter that is applicable for a variety of fields.

In order to accomplish these objects, the invention provides an A/D converter which comprises a sampling circuit for sampling an analog signal during a sampling period, a conversion circuit, operatively connected to said sampling circuit, for converting the analog signal to a digital signal during a conversion period and a control circuit, operatively connected to said sampling circuit and said converting circuit, for controlling the respective lengths (i.e., time durations) of the sampling period and the conversion period, independently; further, in the analog-to-digital converter according to the present invention, the control circuit varies respective lengths of the sampling period and the conversion period independently, in accordance with control information.

At least one of the sampling times and bit conversion times used by the A/D conversion circuit is independently changed by a corresponding sampling time control circuit and bit conversion time control circuit.

We have studied the problems of the conventional techniques and found that the conventional A/D converters operating even at a high frequency have a relatively large margin in their conversion time. Based on this finding, we have decided to design an A/D converter with its sampling time and bit conversion time being changeable independently of each other so that, when clock frequency increases, the conversion time may be reduced while the sampling time is extended. The A/D converter of this arrangement can solve the problems associated with conventional A/D converters.

The A/D converter according to the invention shortens the bit conversion time and adds the time thus spared to the sampling time to achieve a high-speed conversion operation.

It is naturally possible for the A/D converter of the invention to shorten both the sampling time and bit conversion time, or shorten the sampling time and extend the bit conversion time, or extend both the sampling time and bit conversion time. The invention may employ any combination of respective lengths of the sampling time and the bit conversion time.

BRIEF DESCRIPTION OF THE DRAWINGS

FIGS. 7(A) to 7(C) are diagram of examples of registers used in the A/D converter of FIG. 6;

FIGS. 12A and 12B in the composite are a block diagram of another embodiment of the A/D converter of the present invention.

DESCRIPTION OF THE PREFERRED EMBODIMENTS

Embodiments of the invention will be explained in detail with reference to the drawings. In the following explanation, an A/D conversion time of an A/D converter is defined as the sum of the sampling time and the bit conversion time, in which the bit conversion time is equal to a conversion time "t" per bit, multiplied by the number of bits of "n".

Figure 1:
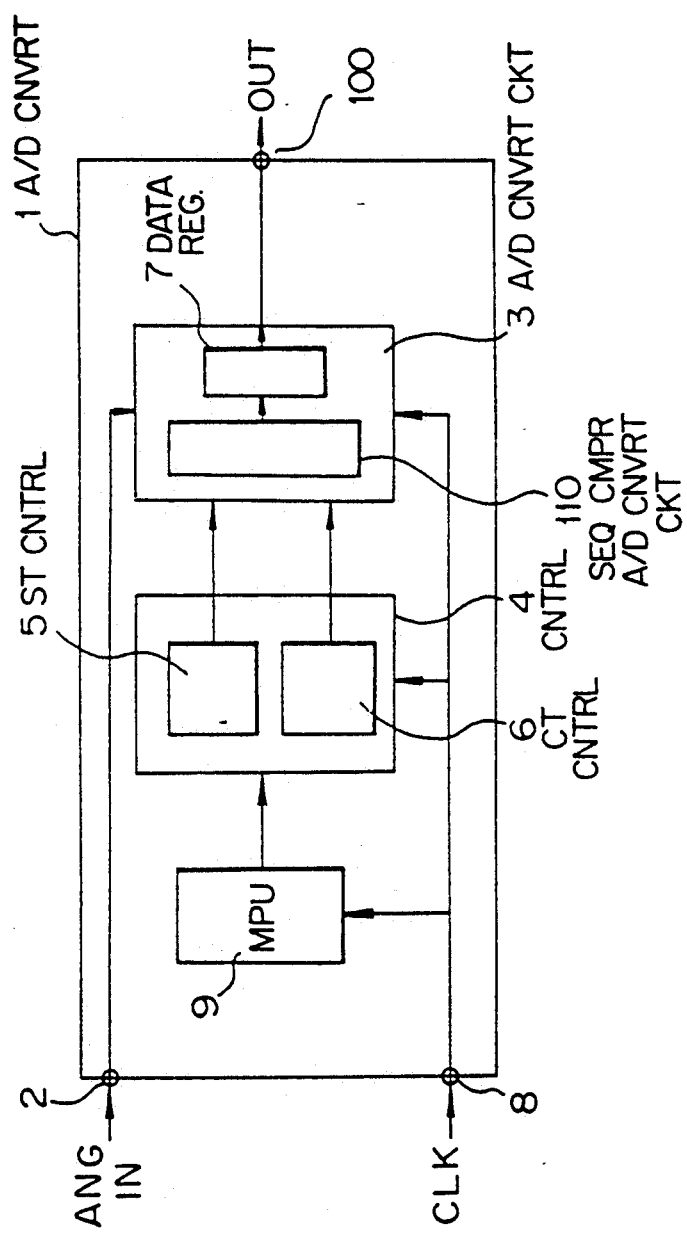
FIG. 1 is a block diagram showing the principle of an A/D conveyor according to the invention.

FIG. 1 shows the principle of an A/D converter according to the invention

The A/D converter ("A/D CNRT") 1 comprises an analog ("ANG") data input terminal 2, an A/D conversion circuit ("A/D CNVRTCRT") a digital data output terminal (out) 100, a controller ("CNTRL") 4 for controlling an A/D conversion time, and a control clock signal input terminal 8.

The controller 4 includes a sampling time control circuit ("STCNTRL") 5 and a bit conversion time control circuit ("CTCNTRL") 6.

The A/D conversion circuit 3 includes, for example, a sequential comparison unit 110 and a data register ("DATA REG") 7.

The controller 4 of the A/D converter 1 is preferably controlled by a proper control means 9 such as a microcomputer (MPU) disposed inside or outside the A/D converter 1.

A sampling time and a bit conversion time (a conversion time "t" per bit multiplied by the number of bits "n") of the A/D conversion circuit 3 are optionally determined by the sampling time control circuit 5 and bit conversion time control circuit 6, respectively, independently of each other.

Each of the sampling time control circuit 5 and bit conversion time control circuit 6 preferably incorporate a circuit having a proper frequency dividing or multiplying function for switching to a selected one of a plurality of frequencies.

When a frequency presently used is to be changed to another according to a user's request or a hardware request, the invention achieves this by changing the present sampling time and bit conversion time (generally, the sampling time and bit conversion time are the same). For this purpose, the invention activates the controller 4 according to data from the proper control means 9 such as a microcomputer, and changes one or both of the present sampling time and bit conversion time, thereby changing the distribution ratio.

The invention is able to change the A/D conversion time, which is a sum of the sampling time and bit conversion time, as required, but basically is unable to change the same below a resolution that is determined by the hardware used.

Figure 2:
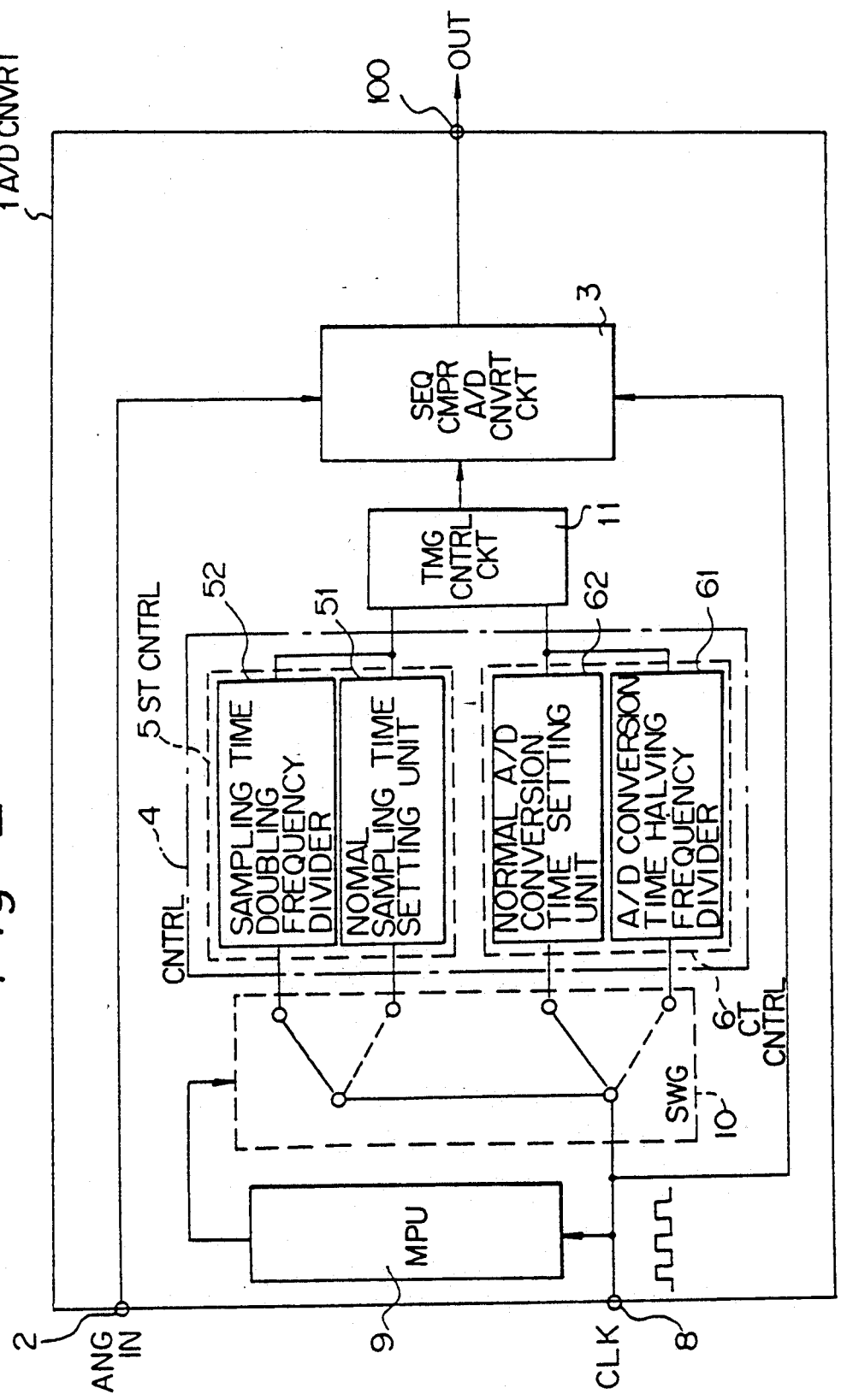
FIG. 2 is a block diagram showing an A/D converter according to an embodiment of the invention.

FIG. 2 shows an A/D converter 1 according to an embodiment of the invention.

The A/D converter 1 has a sequential comparison A/D conversion circuit 3 ("SEQ CMPR A/D CNVRT CKT") and a controller 4. The controller 4 includes a sampling time control circuit 5 and a bit conversion time control circuit 6.

The sampling time control circuit 5 comprises a normal sampling time setting unit 51 and a time doubling frequency divider 52 for setting a sampling time that is twice the normal sampling time.

The bit conversion time control circuit 6 comprises a normal bit conversion time setting unit 61 for setting a normal bit conversion time and a time halving frequency divider 62 for setting a bit conversion time that is half the normal bit conversion time.

A switching unit (SWG) 10 for selectively switching to these units 51, 52, 61, and 62 is connected to a proper control unit 9 such as a microcomputer (MPU). According to data provided by the control unit 9, the switching unit 10 is operated to set required conditions.

For example, the normal sampling time setting unit 51 and normal bit conversion time setting unit 61 are used each having with a normal frequency, to carry out a normal bit converting operation. If there is a need for doubling the processing frequency, the control unit 9 controls the switching unit 10 to switch from the normal sampling time setting unit 51 of the sampling time control circuit 5 to the time doubling frequency divider 52 for a sampling time band, and to switch from the normal bit conversion time setting unit 61 of the bit conversion time control circuit 6 to the time halving frequency divider 62 for a bit conversion time band.

Control signals from the control circuits 5 and 6 of the controller 4 are provided to the A/D conversion circuit 3 through a timing control circuit ("TMG GNTRL CKT") 11.

According to the selected timing data from the controller 4, the timing control circuit 11 defines the sampling time the and bit conversion time and, during the bit conversion time band, sequentially shifts comparison circuits disposed in the A/D conversion circuit 3.

Unlike the conventional A/D converter, which may cause a shortage in a sampling time when a frequency is increased, the invention can secure a sufficient sampling time while shortening a bit conversion time.

The effect of the embodiment will be explained with reference to FIGS. 3, parts (A) to (C), which illustrate the conversion of 10-bit analog data into digital data at a frequency ("f") of 8 MHz.

Figure 3:
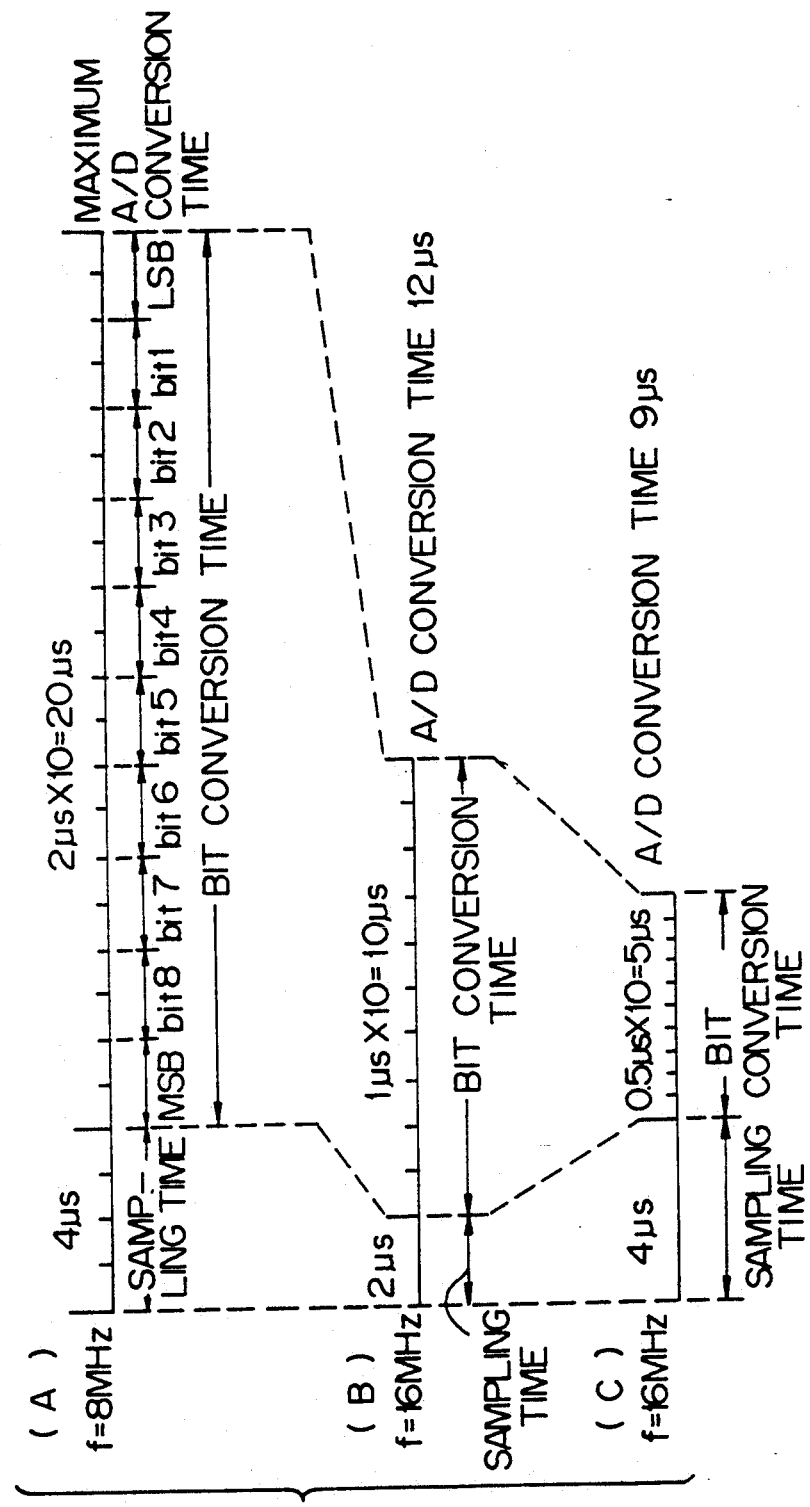
FIG. 3 is a plot showing the effect of the A/D converter according to the invention.

FIG. 3 part (A) shows the conventional technique. This involves a sampling time of 4 $\mu$s and a bit conversion time of 0.5 $\mu$s/bit. It is supposed that the present bit conversion time is 2 $\mu$s per bit. This results in a conversion processing time of 24 $\mu$s at the maximum.

To improve the processing speed, the frequency f may be doubled to 16 MHz. As a result, the sampling time will be reduced to 2 $\mu$s to cause a shortage of 2 $\mu$s in the sampling time, as shown in FIG. 3 part (B). Namely, the total conversion time of the conventional A/D converter may be reduced to 12 $\mu$s but it may not operate satisfactorily because of a shortage in the sampling time.

According to the embodiment of the invention, the sampling time and bit conversion time are not fixed but flexible (i.e. adjustable). When the frequency f is increased to 16 MHz, the bit conversion time may be reduced to 0.5 $\mu$s with a processing margin that may be used for increasing the sampling time. To achieve this, the time doubling frequency divider 52 of the sampling control circuit 5 and the time halving frequency divider 62 of the bit conversion control circuit 6 are selected to secure the sampling time of 4 $\mu$s as shown in FIG. 3 part (C).

In this way, the invention can further shorten the A/D conversion time of 12 $\mu$s (FIG. 3 part (B)) of the high-speed mode of the conventional technique to 9 $\mu$s (FIG. 3 part (C)) without difficulty, thereby improving the performance of the A/D converter.

As explained above, this embodiment arranges a plurality of frequency dividing/multiplying means in the sampling time control circuit 5 and bit conversion time control circuit 6 of the controller 4, and properly selects the frequency dividing/multiplying means according to control data from the control unit 9, to optionally or selectively set a desired sampling time and a desired bit conversion time.

Figure 4:
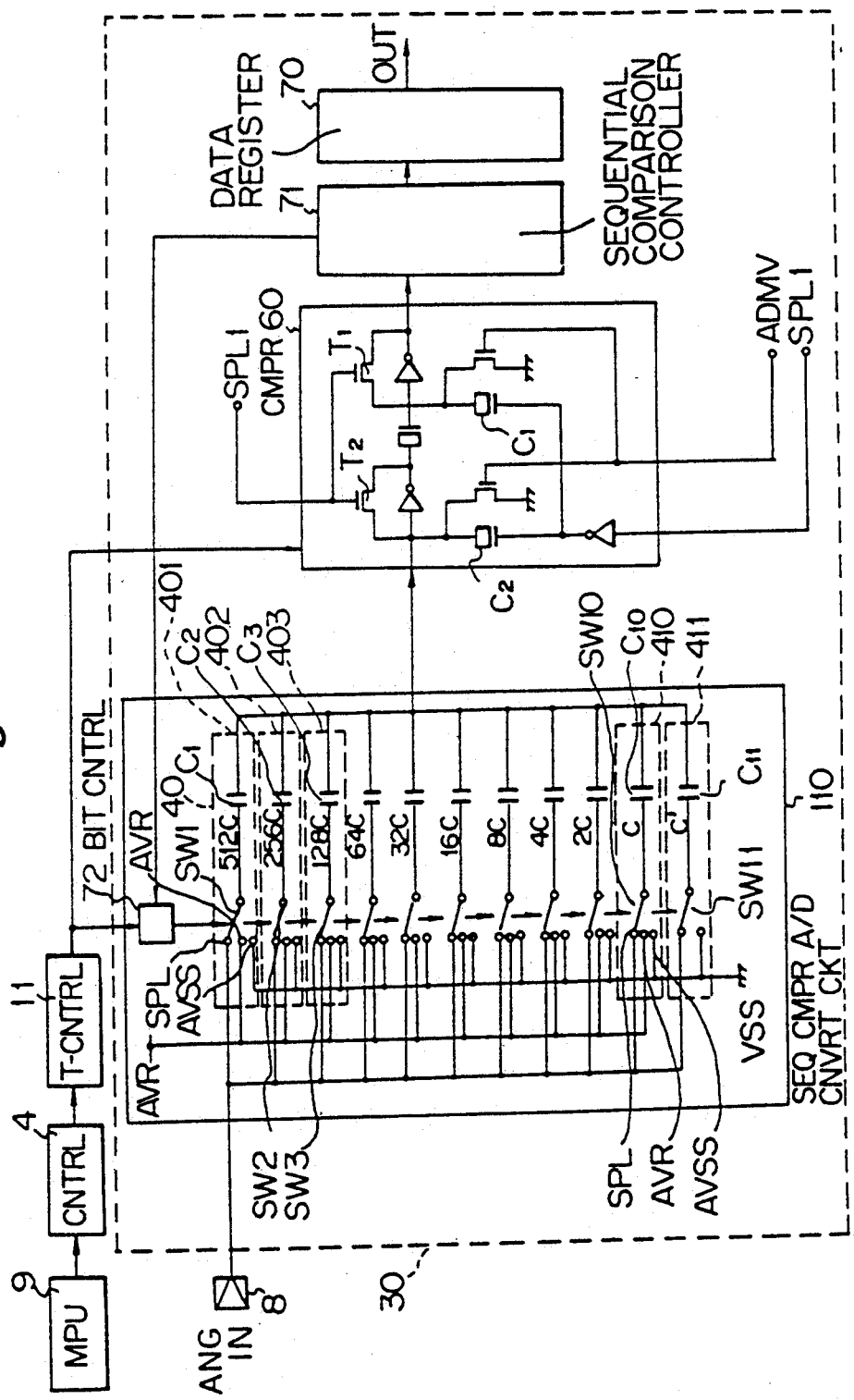
FIG. 4 is a block diagram of an A/D conversion circuit disposed in the A/D converter according to the invention.

FIG. 4 shows an A/D converter involving an A/D conversion circuit 30 including a sequential comparison A/D conversion unit 110, according to another embodiment of the invention. The A/D conversion circuit 30 does not limit the invention. The invention may be implemented, instead, with any other known bit conversion means.

In FIG. 4, the transistors T1 and T2 comprise N-channel MOS FETs while the capacitors C1 and C2 comprise P-channel MOS FETs respectively.

In FIG. 4, the A/D conversion unit 110 is a charge-redistribution 10-bit sequential comparison A/D conversion circuit comprising plural conversion units 40 (401 through 411) corresponding to 10 bits, respectively. Each of the conversion units 401 to 411 comprises a capacitor C, a sampling input terminal SPL, an analog reference voltage terminal AVR, a ground terminal AVSS, and a switch SW for selecting between these terminals.

A control unit 9 such as a microcomputer ("MPU") (T-"CNRL") controls a controller 4, which drives a timing controller 11. The timing controller 11 sequentially activates the switches SW1 to SW11 of the conversion units 401 to 411.

The capacitors C1 to C11 have different respective capacitance values. For example, the capacitor C1 of the conversion unit 401 402 corresponding to a most significant bit (MSB) has a capacitanece value 512C, i.e., 512 times the capacitate of C. Similarly, the capacitor C2 of the conversion unit corresponding to a second significant bit has a capacitance of 256C. In this way, the conversion units 401 to 411 have respective capacitances that are sequentially halved, to appropriately weight each bit during a converting operation.

Namely, the sequential comparison A/D conversion unit 110 processes 10 bits, and the capacitance of each of the capacitors C1 to C11 is weighted such that the capacitance of one capacitor is twice the capacitance of the seccessive, next lower capacitor, starting from the capacitor C11 corresponding to the least significant bit (LSB) and having the unit capacitance C.

When sampled analog data is provided to an analog input port 8, all of the switches SW1 to SW11 are connected to the sampling input terminals SPL, so that the input analog data charged to the capacitors C1 to C11.

The switches SW1 to SW11 are then switched to the ground terminals AVSS. Thereafter, the timing controller 11 sequentially controls the switches SW1 to SW11 so as to be sequentially connected to the analog reference voltage terminals AVR of the conversion units 401 to 411. As a result, the charges at the capacitors C1 to C11 of the conversion units 401 to 411 as charged by the voltage of the input analog data, are sequentially compared with an analog reference voltage in a comparator ("CMPR") 60. If the charged voltage of one capacitor is greater than the analog reference voltage, the switch SW for that capacitor is kept connected to the analog reference voltage terminal AVR, and if it is not greater than the analog reference voltage, the corresponding switch SW is connected to the ground terminal AVSS. In this way, a digital value of 1 or 0 is set, bit by bit.

Such a sequential comparison is carried out for all bits through a bit control circuit ("B/T CNTRL") 72 thereby to convert the analog data into digital data, which is stored in a data register 70 through a sequential comparison control circuit 71.

As mentioned above, if the sampling time causes a shortage when improving the A/D conversion speed, the embodiment at least partly reduces the bit conversion time, that usually has a margin i.e., sparetime, and adds the spare time to the sampling time, thereby extending the sampling time to a required extent.

According to the invention, the ratio of the distribution of the total A/D conversion time into the sampling time and bit conversion time is properly determined.

A circuit for determining the ratio of distribution of the A/D conversion time is not particularly limited. For example, an A/D control register may be used to set the distribution ratio.

Figure 5:
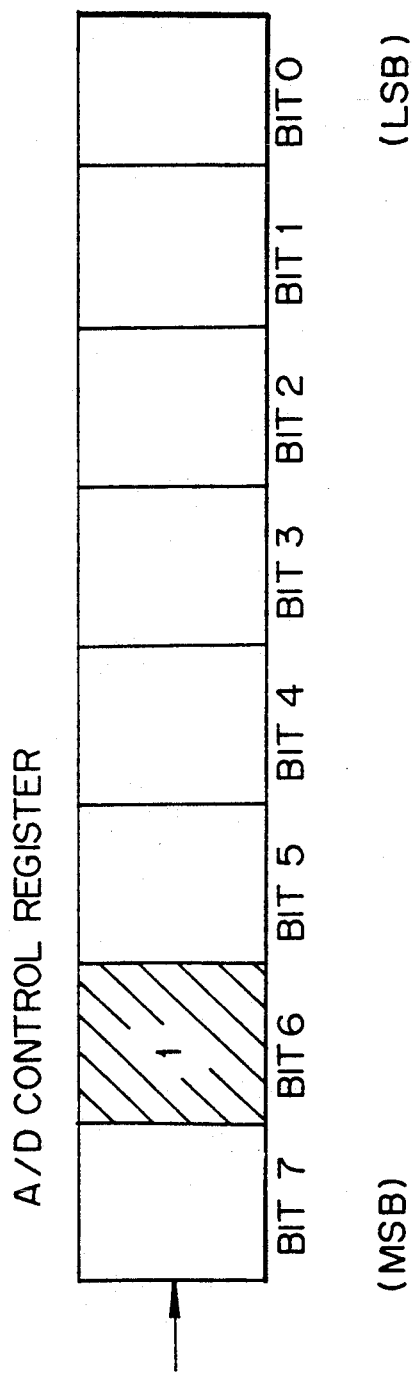
FIG. 5 is a diagrams of an example of a control register of the A/D converter of the invention.

FIG. 5 shows a control register serving as the controller 4 according to the invention. The control register may be disposed in a microcomputer. When a bit 6 of the control register is 1, for example, the distribution ratio of the sampling time and bit conversion time is changed.

According to the invention, it is also possible to change the conversion time of each bit.

For example, the bit conversion time for the most significant, 8th, and 7th bits, which usually bear a larger load than the other bits, is set to be three fourths of, or equal to, a normal conversion time, and a conversion time for the other bits is set to be half the normal conversion time.

Figure 6:
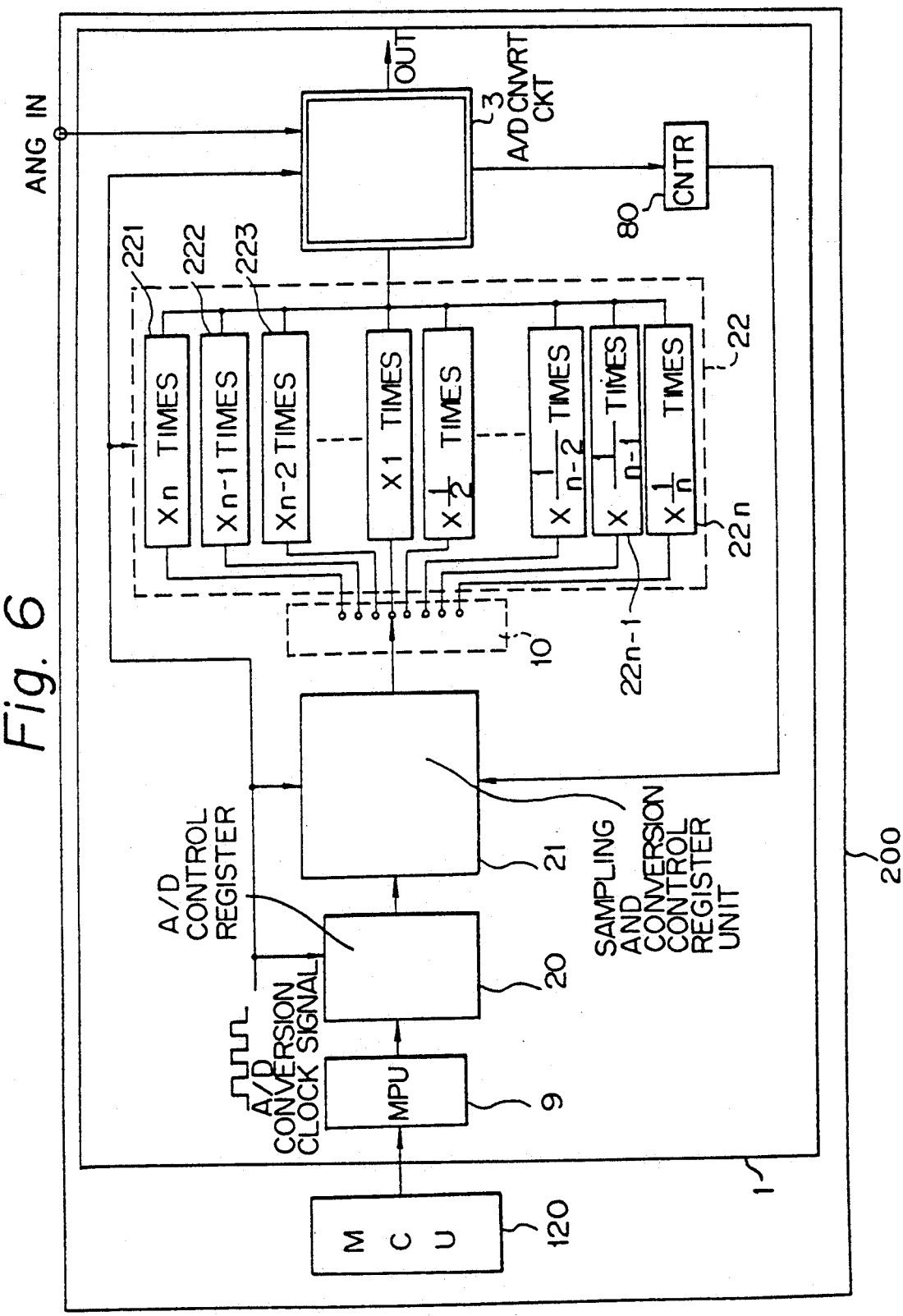
FIG. 6 is a block diagram showing an A/D converter according to another embodiment of the invention.

FIG. 6 is a block diagram showing a computer 200 comprising a MCU 120 and an A/D converter 1 according to another embodiment of the invention. This embodiment optionally sets a sampling time and a bit conversion time under the control of a microcomputer. In the present invention, the MCU 120 and the A/D converter 1 are formed on the same semiconductor substrate to form a one chip micro computer 200.

The A/D converter 1 comprises a control unit 9 connected to microcontrol unit (MCU) 120, an A/D control register 20 receiving an output of the control unit 9 as well as an A/D conversion control clock signal; a sampling and bit conversion control register unit 21 receiving an output of the A/D control register 20 as well as the A/D conversion control clock signal; a sampling time and bit conversion time control circuit 22 including 1/n to n times frequency dividing circuits 221 to 22n receiving an output of the sampling and bit conversion control register unit 21 as well as the A/D conversion control clock signal, an A/D conversion circuit 3, and a counter 80.

In this embodiment, the sampling time control circuit and conversion time control circuit of the previous embodiments are integrated in the sampling time and bit conversion time control circuit 22, which is capable of changing the sampling time as well as the bit conversion time.

In FIG. 6, 10 denotes a switching unit.

FIG. 7(A) shows an example of the A/D control register 20 that determines whether or not the sampling time and A/D conversion time are to be optionally set, and activates the sampling time and conversion time control circuit 22. The A/D control register 20 may be an 8-bit register that establishes a mode for optionally setting the sampling time and conversion time when, for example, a bit 6 is 1.

The sampling and bit conversion control register unit 21 includes registers for setting a required sampling time and a required bit conversion time.

FIG. 7(B) shows an example of the sampling time setting register disposed in the sampling and bit conversion control register unit 21. This sampling time setting register is an 8-bit register that can set, theoretically, $2^8 = 256$ different sampling times. In practice, however, ten different sampling times may be a limit due to hardware restrictions.

According to sampling time data stored in the sampling time setting register, one of the frequency dividing circuits 221 to 22n disposed in the sampling time and bit conversion time control circuit 22 is selected to set a required sampling time.

FIG. 7(C) shows bit conversion time setting registers 1 to 7 disposed in the sampling and bit conversion control register unit 21. The registers 1 to 7 set a respective different conversion times for respectively corresponding ones of the eight bits. It is theoretically possible to optionally set, for each bit, a bit conversion time among $2^8 = 256$ different values.

In this way, this embodiment can optionally set a different bit conversion time for each bit.

To set a bit conversion time for each bit, the frequency dividing circuits 221 to 22n disposed in the sampling time and conversion time control circuit 22 are selected according to data stored in the bit conversion time setting registers 1 to 7 of the sampling and bit conversion control register unit 21.

For this purpose, a switching unit 11 is disposed between the sampling and bit conversion control register unit 21 and the sampling time and conversion time control circuit 22.

According to the embodiment, a switching operation is carried out nine times, one for setting the sampling time, and the other eight for setting the bit conversion time of each bit.

The A/D conversion circuit 3 of this embodiment is the same as that explained with reference to FIG. 3.

The counter 80 counts the number of bit conversion cycles, and feeds it back to the sampling and bit conversion control register unit 21.

The nine switching operations mean that an A/D conversion is completed in nine cycles, one sampling cycle and eight one-bit conversion cycles.

The counter 80 counts the number of operation cycles, and when nine is counted, an end flag is set. When the count is less than nine, a flag indicating that there is still a bit to be converted is established and fed back to the sampling and bit conversion control register unit 21.

The counter 80 of this embodiment is configured to realize nine times of switching selections, and therefore, is provided with a fixed value of 9 in advance.

If a user wants to finish the A/D conversion operation with six one-bit conversion cycles to shorten conversion time, the conventional technique will a force the user to replace the A/D converter with another with 6-bit digital output. If such a 6-bit A/D converter is not available, it must be newly fabricated. In this case, the user may have to use, for reasons of economy the 8-bit A/D converter for the 6-bit requirement.

Such a risk concerning over specifications can be solved by the present invention. With the high-resolution A/D conversion circuit 3, the counter 80 of the A/D converter 1 of FIG. 6 can be set with a number of 7 for six one-bit conversion cycles.

Figure 8:
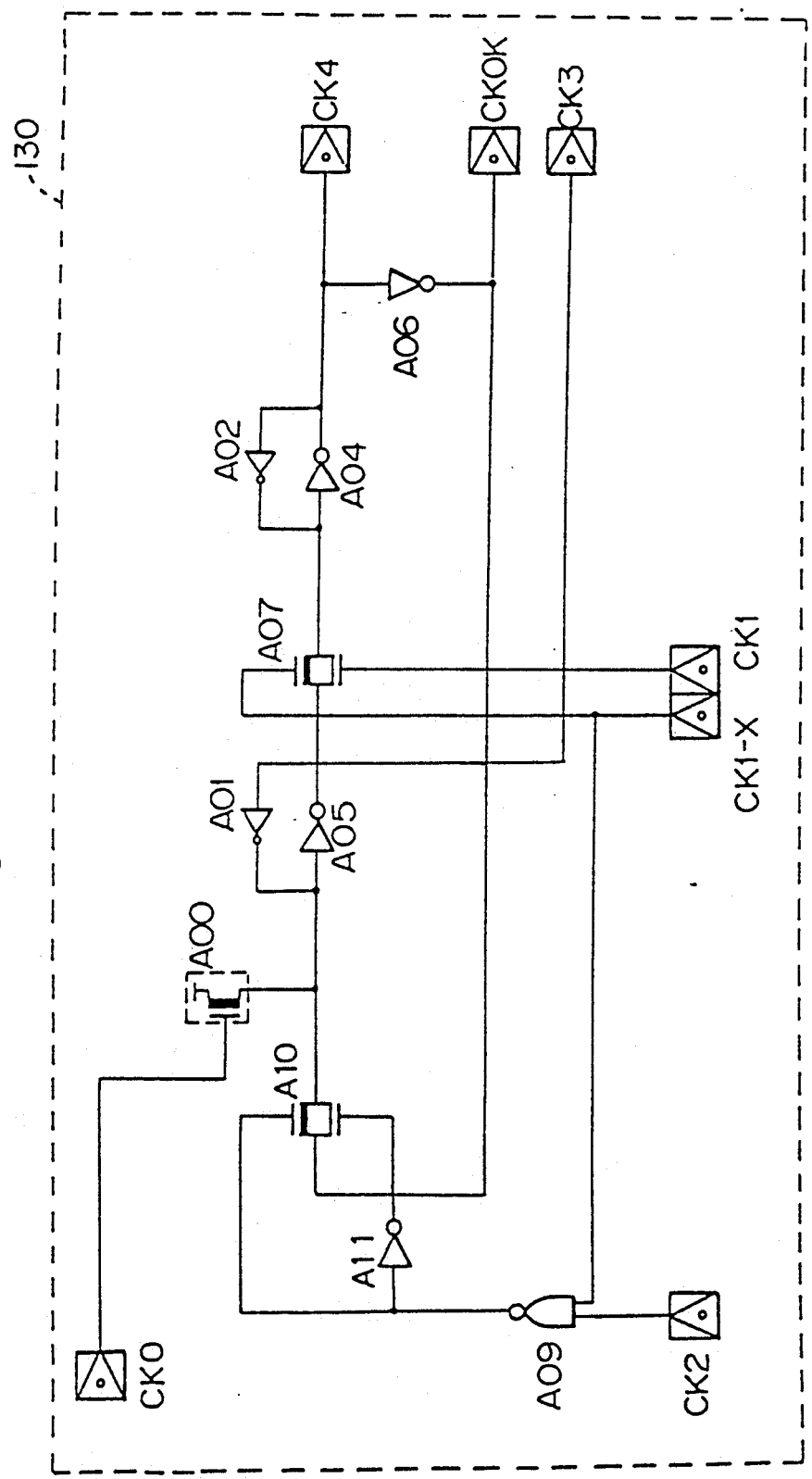
FIG. 8 is a circuit diagram showing a prescaler employable in the invention.

FIG. 8 shows a prescaler circuit 130 used for the timing control circuit 11 of FIG. 2, for changing and adjusting a sampling time and/or a bit conversion time in the A/D converter. The prescaler 130 of FIG. 8 has a known arrangement and the prescaler 130 optionally provides a frequency dividing of multiplying clock signal with respect to an input signal which is input thereto.

As shown in FIG. 8, one embodiment of the prescaler has a circuit construction which comprises clock input terminals CK0, CK1, CK1-X, CK2, clock output terminals CK3, CK4, CKOK a NAND gate A09, inverters A01, A02, A04, A05, A06, A11, P-channel MOS FET A00, and transfer gates A07, A10 each of which comprises a P-channel MOS FET and an N-channel MOS FET, oppositely arranged with each other.

The A/D converter of the present invention as explained above is provided with a switching circuit as shown in FIGS. 2 and 6, as a switching unit or means 10, for changing and adjusting the sampling time and/or the bit conversion time.

But in the present invention, the switching unit or means 10 is not restricted to only the switching circuit as shown in FIGS. 2 and 6 and any kind of switching means having the same function as described above can be used.

Therefore, another embodiment of the switching means 10 of the present invention will be explained with reference to FIGS. 9 and 10, hereunder.

Figure 9:
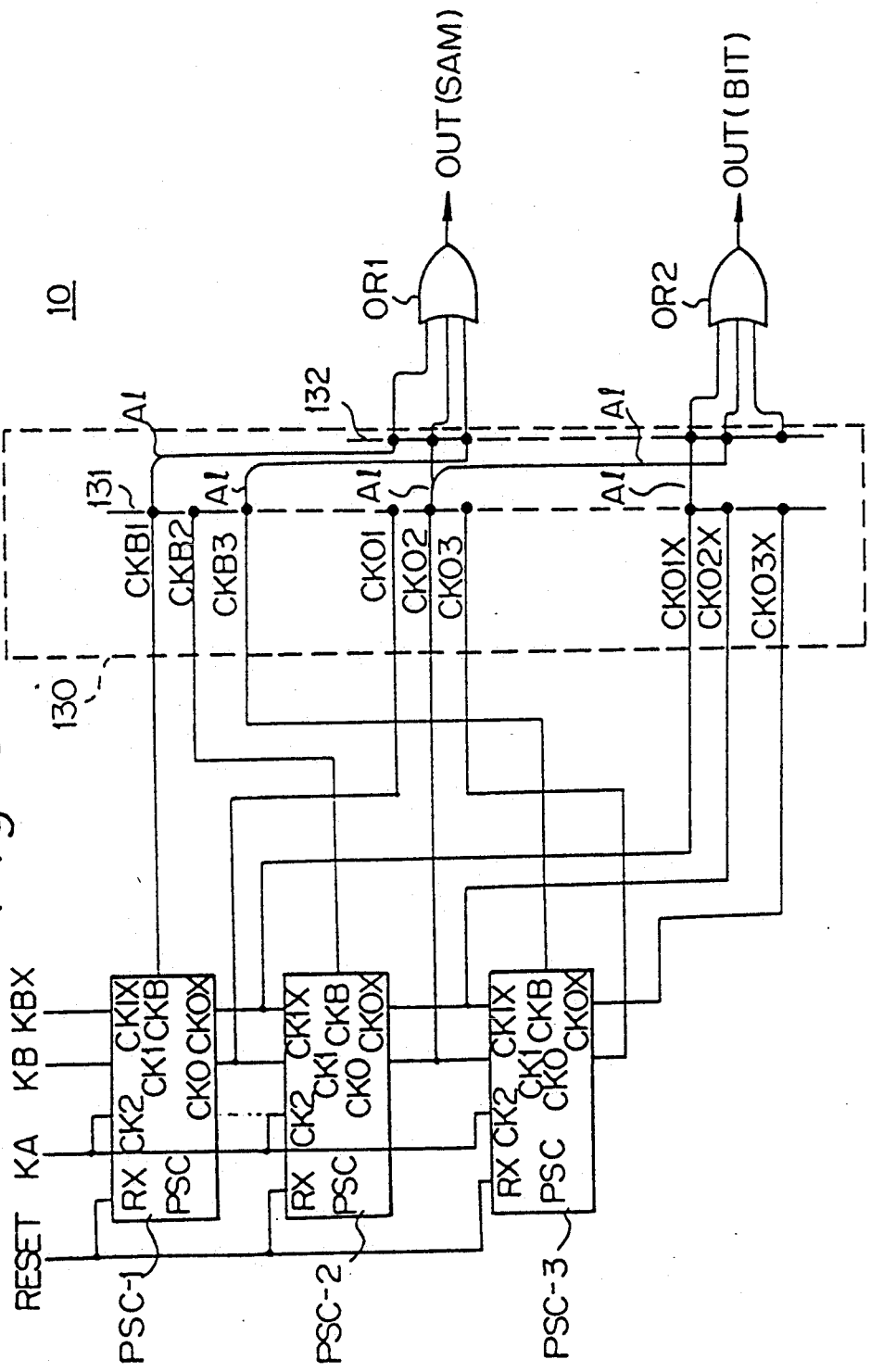
FIG. 9 is a circuit diagram of a timing controller employing three prescalers disposed in parallel with each other.

FIG. 9 shows a second embodiment of the switching means 10 of the present invention in which three prescalers PSC-1 to PSC-3 are provided, arranged in parallel to each other.

Each of the prescalers PSC-1 to PSC-3 has the same construction as shown in FIG. 8 and includes at least two input terminals CK1 and CK2 and three output terminals CKB, CKO and CKOX, wherein, output terminal CKOX is a complementary signal CKO.

Each of the prescalers PSC-1 to PSC-3 is connected to each other with wires as shown in FIG. 9 and one input signal KA is input to the input terminal CK2 of each one of the prescalers PSC-1 to PSC-3 and another input signal KB is input to the input terminal CK1 of the prescaler PSC-1.

The respective output terminals of the prescalers PSC-1, PSC-2 and PSC-3 are connected to respective connecting terminals 131, forming a first connector line provided in a switching circuit 130 with a wiring pattern as shown in FIG. 9, and another connecting terminal 132, forming a second connector line provided in the switching circuit 130; One group of associated connecting terminals 132 are connected to respective input terminals of an OR gate circuit OR1 having three input terminals and another group of associated connecting terminals 132 are connected to respective input terminals of an OR gate circuit OR2 having three input terminals.

A plurality of selected connecting terminals 131 are connected to any one of selected connecting terminals 132 by Al-wires to output a control pulse signal having an optional divided frequency output from any one of the OR gate circuits OR1 and OR2.

Note, that the number of the divided frequencies of pulse signals can be determined by the configuration of the wiring formed between the outputs of the prescalers and the connecting terminals 131 and the selection of the connecting terminals 131 and connecting terminals 132 which are selectively coupled to each other.

In this embodiment the OR gate circuit OR1 provides a pulse signal "Out (SAM)" used for controlling the sampling time while the OR gate circuit OR2 provides a pulse signal "OUT (BIT)" used for controlling the bit conversion time.

In this embodiment, although three prescalers are used, any number of prescalers can be used. In the connecting plate 130 as shown in FIG. 9, the connecting line made of Al can be formed by a master-slice method, to thereby enable changing the length or position of the Al wire on the basis of customer's demands.

Figure 10:
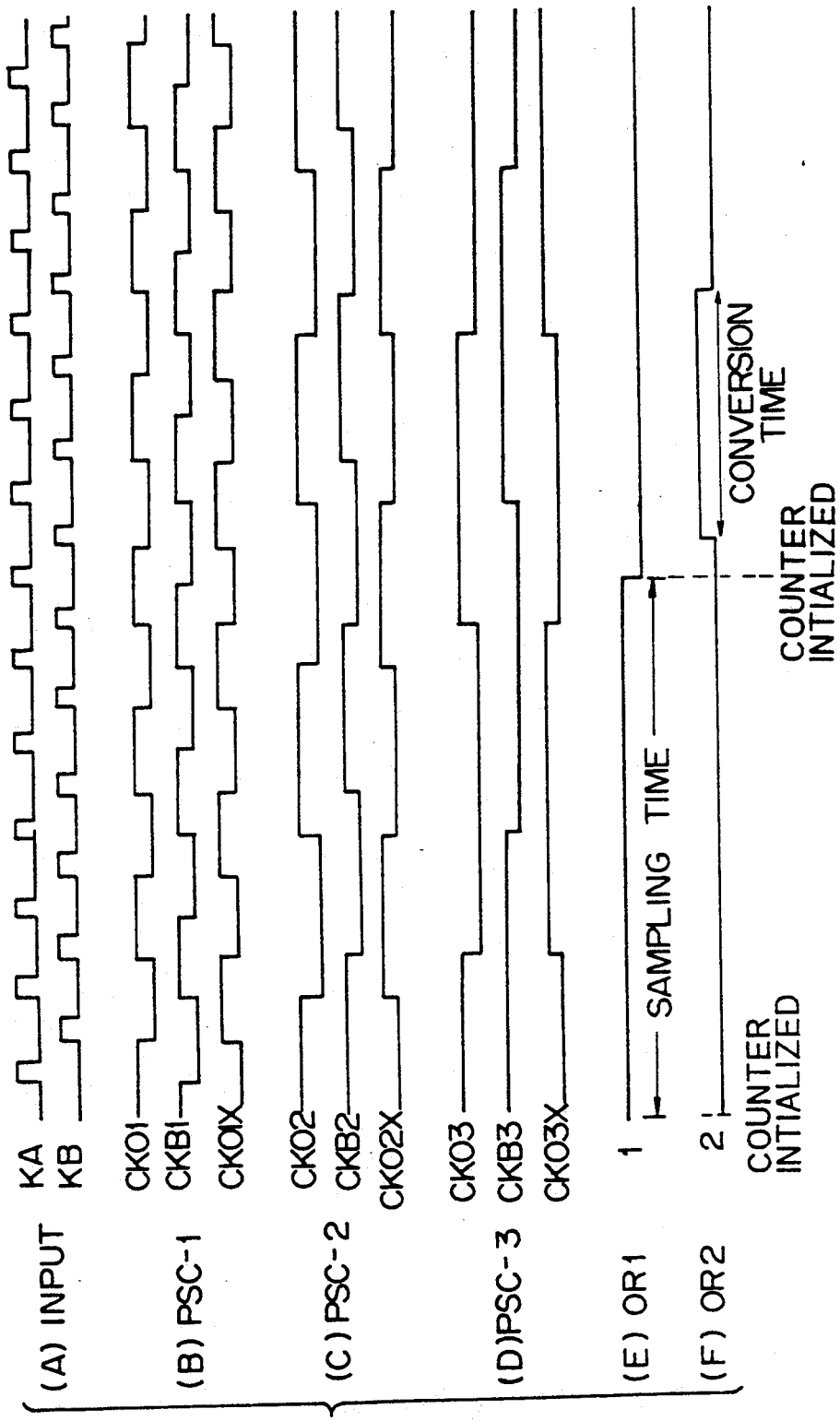
FIG. 10 is a plot of input and output waveforms of the prescaler.

FIG. 10 shows plot of examples of input and output waveforms of the prescalers PSC1-PSC3. The prescaler PSC-1 receives a clock signal KB, its inverted signal KBX, and a clock signal KA, and provides output clock signals CK01, CK01X, and CKB1 whose frequencies are half of those of the input signals. In the prescalers PSC1-PSC3, the input clock signals KB and KA must not overlap one another. To secure this, a non-overlap assurance is carried out.

FIG. 10 shows wave forms (A) to (F) generated from respective prescalers (A) shows input pulse signals KA and KB to the first prescaler PSC-1, (B) shows output pulse signals CK01, CKB1 and CK01X of the first prescaler PSC-1, (C) shows output pulse signals CK02, CKB2 and CK02X of the second prescaler PSC-2, (D) shows output pulse signals CK03, CKB3 and CK03X of the third prescaler PSC-3, (E) shows output pulse signals output from the OR gate OR1 as a controlling signal used for the sampling time and (F) shows output pulse signals output from the OR gate OR2 as a controlling signal used for the bit conversion time.

In FIG. 10, wave forms (E) OR1 and (F) OR2 are not always both generated, but are generated alternately to set a sampling time and a conversion time successively as in the same configuration as shown in the Figure.

Each of the signals (E) OR1 and (F) OR2 initialized a counter when it is generated.

This controlling operation is carried out by a control logic for A/D converter to ensure performance of the operation as shown in FIG. 3.

Figure 11:
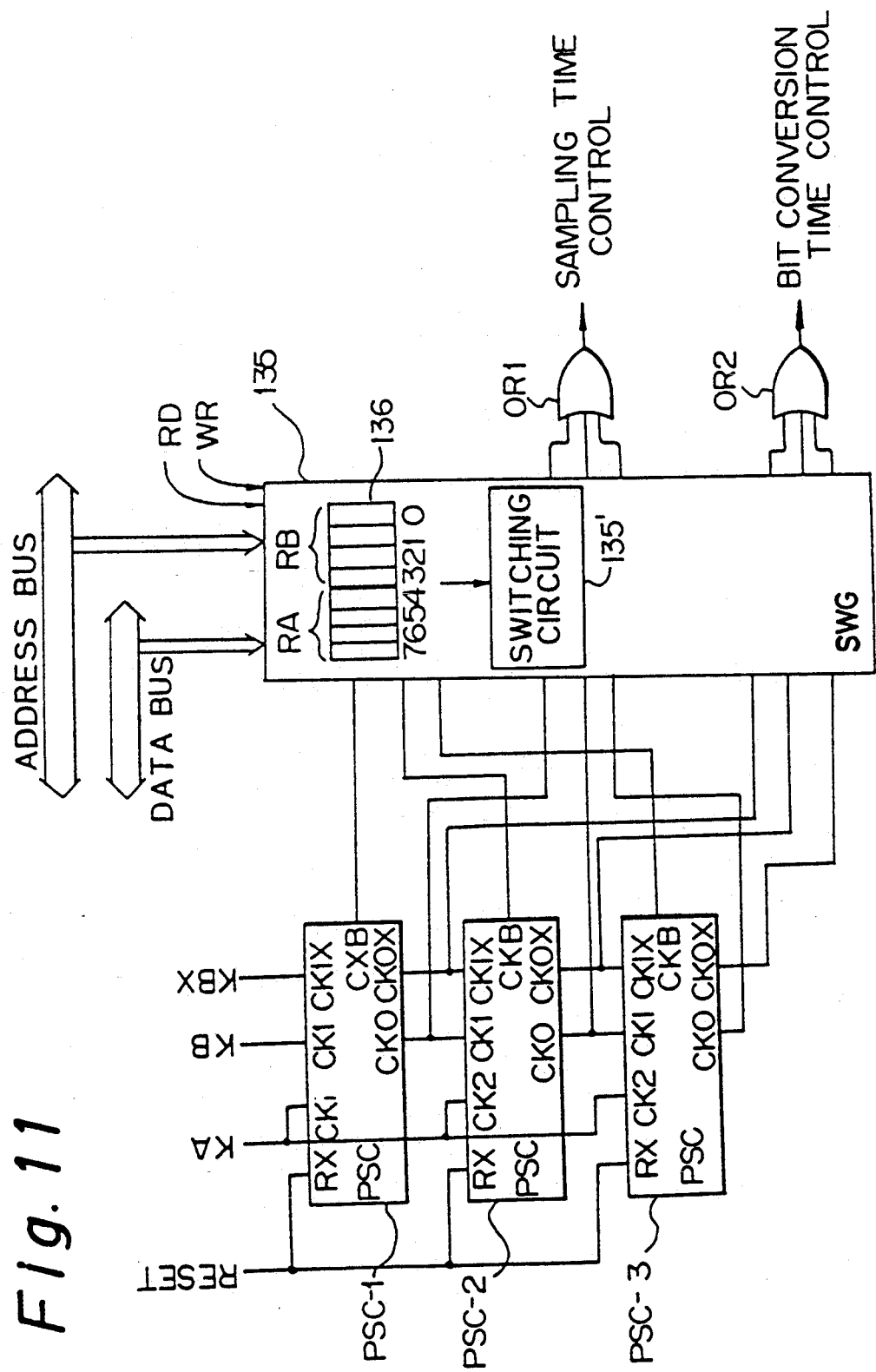
FIG. 11 is a block diagram of another embodiment of the switching means of the present invention utilizing a register.

FIG. 11 shows a third embodiment of the switching unit or means 10 of the present invention in which a switching device ("SWG") 135 is provided between the prescalers PSC-1 to PSC-3 and OR gate circuits OR1 and OR2, instead of the connecting plate as used in the previous embodiment. Switching device 135 includes switching circuit 135' which is controlled by Data RA and RB.

In the switching device 135, at least one register 136 is provided therein for controlling the sampling time and the bit conversion time and a certain amount of the register area RA is allocated for the sampling time and another area RB thereof is allocated for the bit conversion time. A read signal RD and a write signal WR are supplied to the switching device 135.

As explained above, the prescalers PSC1-PSC3 are arranged in parallel to each other, and inputs and outputs thereof are connected to one another as shown in the figure, so that one prescaler PSC may provide clock signals (CKO and CKB) whose frequencies are 1/n of the frequencies of signals provided by a preceding prescaler PSC. These output signals are collected by OR gate circuits OR1, OR2 which select and provides one or a combination of the clock signals. In this way, a clock signal having an optional i.e., selectable frequency can easily be obtained.

The switching means 10 of FIG. 9 according to the invention may employ aluminum wiring whose bulk is adjusted to a predetermined length to change a bit conversion time and/or a sampling time. Alternatively, the switching means 10 may have registers for storing a sampling time and a bit conversion time as shown in FIG. 11. The former method, however, has a shortcoming in that no change is allowed once the A/D converter is fabricated. On the other hand, the latter method allows optional changes and an adjustment to be made in the A/D converter after fabrication.

Another example of a bit conversion circuit according to the invention will be explained.

The bit conversion circuits of the previous embodiments have the sequential comparison circuit employing weighted capacitors. The invention is not limited to such an arrangement. For example, the invention may employ a ladder configuration of resistors, or a combination of resistors and capacitors.

Figure 12B:
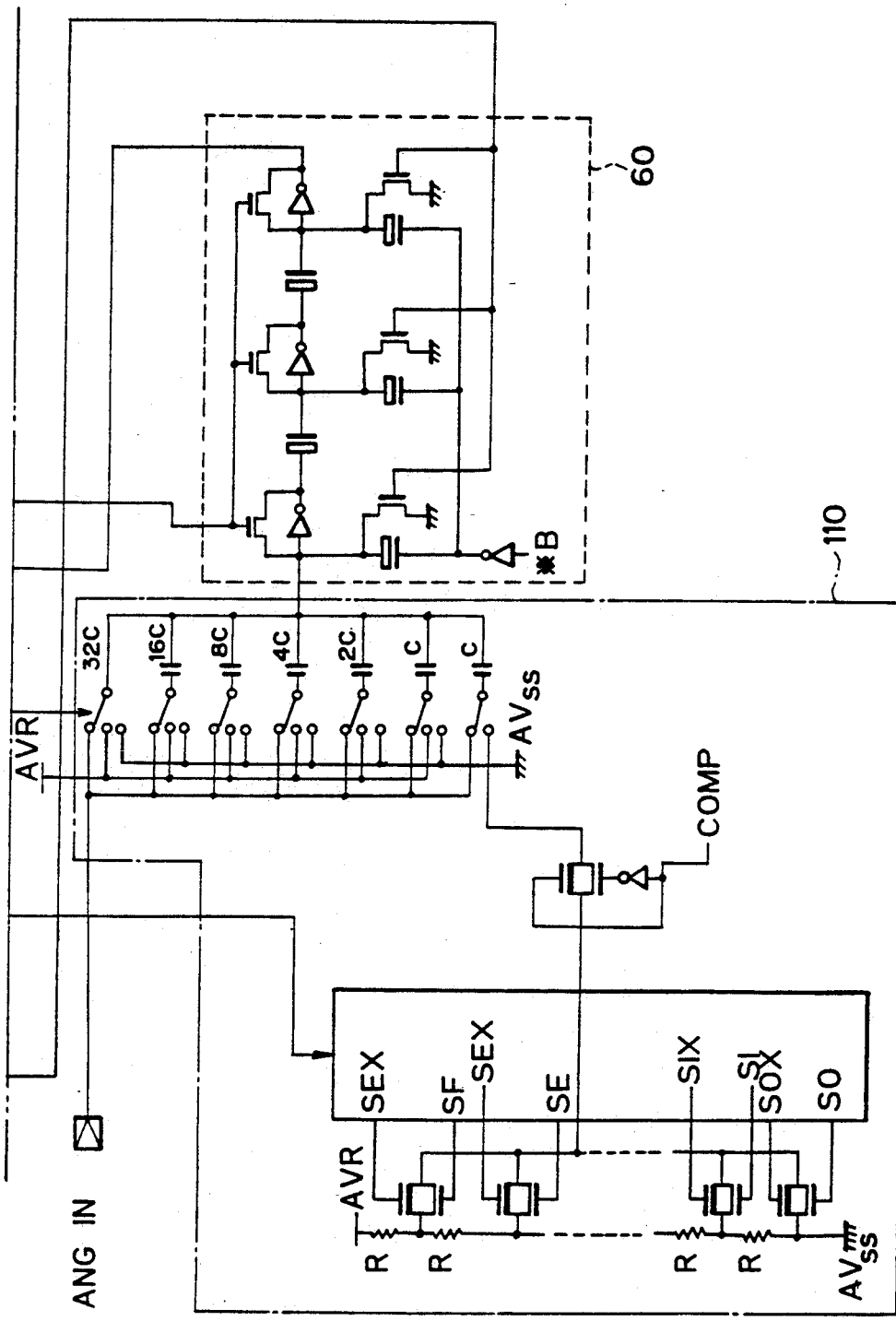

FIGS 12A and 12B, in the composite, show a sequential conversion circuit employing a combination of resistors and capacitors according to another embodiment of the invention. Since this embodiment employs a small number of capacitors, it is effective in shortening the bit conversion time; the basic construction thereof is similar to that as shown in FIG. 4.

The switching means 10 of this embodiment has the same construction as shown in FIG. 9 and further in a sequential comparison A/D conversion unit 110 of this embodiment, each one of the first 6 bits from the MSB consists of a capacitor and each one of the last 4 bits to the LSB consists of a resistor the resistors used in this unit form being in a ladder configuration.

In this embodiment, a controlling register 4 is used for starting the operation of A/D conversion, for example, in response to a write or read command input thereto utilizing data provided from an address bus and a data bus connected to a computer or the like, and a SAR register ("SAR REG") 70 is a register ("SAR-REG") for storing the results of the conversion of each of the bits and outputs the results thereof to a data bus of a microcontrol unit (MCU), included in a micro computer, in response to a read command RD.

In FIG. 12A, connecting wires provided in the connecting portion CT are formed by a master-slice method such as the method explained in FIG. 9.

The switching control of this portion may be carried out with a switching device comprising transistors.

In this case, the controlling data should be stored in a suitable controlling register and the switching operation is carried out utilizing the stored data.

Figure 13:
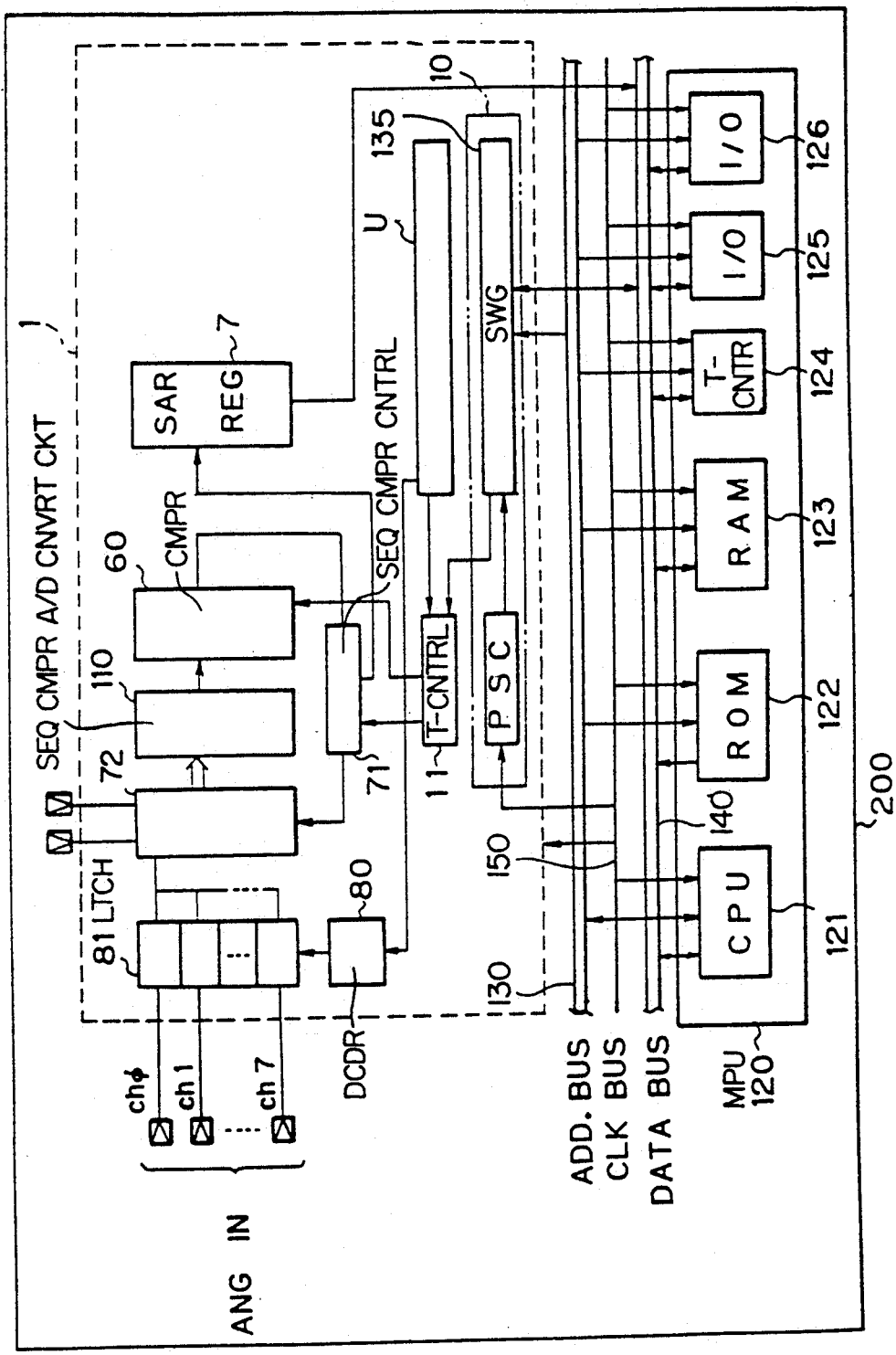
FIG. 13 is a block diagram of a connecting relationship between the A/D converter of the present invention and a microcomputer unit.

FIG. 13 is a schematic view of a connection relationship between the A/D converter 1 and the micro-control unit (MCU) 120 included in a micro computer of the present invention.

Analog data are input to a latch circuit 81 of the A/D converter 1 through suitable channels Ch0 to Ch7 and the data thus latched into the latch circuit ("LTCH") 81 are sequentially transferred to the switching means 10 in response to a driving pulse input to the latch circuit 81 through a channel decoder ("DCDR") 80.

On the other hand, the MCU used in the present invention comprises, for example, CPU 121, ROM 122, RAM 123, a timer counter 124, a serial I/0 125 and I/0 port 126 etc. and each one of them is connected to any one of an address bus 130, a data bus 140 and a clock bus 150 respectively as shown in FIG. 13, while the A/D converter 1 is also connected to the MCU 120 through any one of the buses as mentioned above and shown in FIG. 13.

As mentioned above, the present invention provides an accurate high-speed A/D converter having a simple structure.

When a user wants to improve the performance of a microcomputer, the invention may quickly achieve same without influencing A/D conversion accuracy. The A/D converter according to the invention can adapt itself to a wide range of conversion conditions, to reduce costs and improve speed.

A conversion time of the A/D converter of the invention is adjustable in a wide range to extend its service life.

When a user requires an A/D converter with a small number of bits to process, the invention satisfies such requirement by partly using an A/D converter with a large number of bits to process. Through such an adjusting technique, the invention expands the application range of existing A/D converters.

I claim:

1. An analog-to-digital converter comprising:
    a sampling circuit for sampling analog signal during a sampling period;
    a conversion circuit, operatively connected to said sampling circuit, for converting the analog signal sampled by said sampling circuit to a digital signal during a conversion period; and
    a control circuit, operatively connected to said sampling circuit and said converting circuit, for independently controlling the respective durations of the sampling period and the conversion period.

2. An analog-to digital converter according to claim 1, wherein said control circuit controls the respective durations of the sampling period and the conversion period in accordance with control information.

3. An analog-to-digital converter according to claim 2, wherein:
    said sampling circuit operates in accordance with a first clock signal; and
    said conversion circuit operates in accordance with a second clock signal;
    said control circuit comprises a clock supply circuit for supplying the first and second clock signals, the clock supply circuit independently varying the respective frequencies of the first and second clock signals in accordance with said control information.

4. An analog-to-digital converter according to claim 3, wherein said clock supply circuit comprises a clock generating circuit for providing a plurality of clock signals having respective, different frequencies and a switch circuit for selecting the first and second clock signals from the plurality of clock signal sin accordance with said control information.

5. An analog-to-digital converter according to claim 4, wherein said clock supply circuit further comprises a control register means, operatively connected to the switch circuit, for storing the control information.

6. An analog-to-digital converter according to claim 4, wherein the clock generating circuit comprises at least one of a frequency divider circuit and a frequency multiplying circuit, each thereof having a plurality of outputs.

7. An analog-to-digital converter according to claim 1, wherein said analog-to-digital converter is formed in semiconductor substrate, said sampling circuit operates in accordance with a first clock signal, said conversions circuit operates in accordance with a second clock signal, and wherein said control circuit comprises a clock generating circuit for providing plurality of clock signals having respective, different frequencies and a wiring pattern which affords independent selection of the respective frequencies of the first and second clock signals from the plurality of clock signals by a masterslice method.

8. An analog-to-digital converter according to claim 3, further comprising:
    a microcomputer, said analog-to-digital converter and said microcomputer thereof being commonly formed in a semiconductor substrate;
    said control circuit further comprising control register means for storing the control information and a data bus; and
    said microcomputer comprising a data processing unit connected to the control register means via the data bus, the sampling period and the conversion period being individually programmable under control of the data processing unit.

9. An analog-to-digital converter according to claim 1, wherein:
    said conversion circuit comprises:
        a comparator for comparing the analog signal with a reference analog signal,
        a sequential comparison controller, operatively connected to the comparator, for providing and varying the digital signal in accordance with an output of the comparator, and
        a digital-to-analog converter for converting the digital signal to the reference analog signal; and
    said control circuit comprises a clock supply circuit for supplying a first clock signal for said sampling circuit and a second close signal for the sequential comparison controller, the first and second clock signals having independently controlled respective frequencies.

10. An analog-to-digital converter comprising:
    a sampling circuit, which operates in accordance with first clock signal, for sampling an analog signal;
    a conversion circuit, which operates in accordance with a second clock signal, for converting the analog signal sampled by said sampling circuit to a digital signal; and
    a clock supply circuit for supplying the first and second clock signals and which varies, independently, the respective frequencies of the first and second clock signals in accordance with a control information.

11. An analog-to-digital converter, formed in a semiconductor substrate, comprising:
    a sampling circuit, which operates in accordance with a first clock signal, for sampling an analog signal;
    a conversion circuit, which operates in accordance with a second clock signal, for converting the sampled analog signal to a digital signal;
    a clock generating circuit for providing a plurality of clock signals having respective, different frequencies; and
    a wiring pattern affords selection of the first and second clock signals from the plurality of clock signals by a master-slice method.

12. A microcomputer, formed in a semiconductor substrate, comprising:
a data processing unit;
a data bus;
control register means, connected to the data processing unit by the data bus and thereby accessible by said data processing unit, for storing control information; and
an analog-to-digital converter comprising:
a sampling circuit for sampling an analog signal during a sampling period;
a conversion circuit, operatively connected to said sampling circuit, for converting the analog signal sampled by the sampling circuit to a digital signal during a conversion period and providing the digital signal to said data bus, and
a control circuit, operatively connected to said sampling circuit, said converting circuit, and said control register means, for independently controlling the respective durations of the sampling period and the conversion period, in accordance with the control information.

13. A microcomputer, formed in a semiconductor substrate, comprising:
a data processing unit;
a data bus;
a clock generating circuit providing a plurality of clock signals having respective, different frequencies, at least one of the clock signals being supplied to the data processing unit; and
an analog-to-digital converter comprising:
a sampling circuit, which operates in accordance with a first clock signal, for sampling an analog signal,
a conversion circuit, which operates in accordance with a second clock signal, for converting the analog signal sampled by said sampling circuit to a digital signal and providing the digital signal to said data bus, and
a selection circuit for selecting the first and second clock signals from the plurality of clock signals.

14. A microcomputer according to claim 13, further comprising:
control register means, connected to the data processing unit by the data bus and thereby accessible by said data processing unit, for storing control information, the selection circuit being controlled by the control information stored in the control register means.

15. A microcomputer according to claim 13, wherein said selection circuit comprises a wiring pattern which affords selection of the first and second clock signals for the plurality of clock signals by a master-slice method.

* * * * *

UNITED STATES PATENT AND TRADEMARK OFFICE
CERTIFICATE OF CORRECTION

PATENT NO. : 5,260,705
DATED : November 9, 1993
INVENTOR(S) : Keizo INUKAI

It is certified that error appears in the above-indentified patent and that said Letters Patent is hereby corrected as shown below:

Col. 2, line 49, change "diagrams" to --diagram--;
line 55, change "showing" to --of--.

Col. 3, line 13, delete "of" (second occurrence);
line 16, change "("A/D CNRT")" to --("A/D CNVRT")--;
line 18, change "("A/D CONVRTCRT")" to --("A/D CNVRT CKT")--;
line 19, change "(out)" to --("OUT")--;
line 23, change "("STCNTRL") to --("ST CNTRL")--;
line 24, change "("CTCNTRL") to --(CT CNTRL")--;
line 39, change "incorporate" to --incorporates--.

Col. 4, line 8, change "(MPU)" to --("MPU")--;
line 13, delete "with";
line 26, change "GNTRL" to --CNTRL--;
line 29, change "the and" to --and the--.

Col. 5, line 29, delete "(T-"CNRL")";
line 30, after "controller" insert --("T-CNRL")--;
line 35, delete "402";
line 37, change "capacitate" to --capacitance--;
line 53, change "charged to" to --charges--;
line 60, after "411" insert --,--.

Col. 6, line 4, after "72" insert --,--.

Col. 7, line 20, after "set" delete "a".
line 64, after "economy" insert --,--;
line 66, change "over specifications" to --overspecifications--.

Col. 8, line 16, after "A10" insert --,--;
line 53, change "One" to --one--.

UNITED STATES PATENT AND TRADEMARK OFFICE
CERTIFICATE OF CORRECTION

PATENT NO. : 5,260,705
DATED : November 9, 1993
INVENTOR(S) : Keizo INUKAI

It is certified that error appears in the above-indentified patent and that said Letters Patent is hereby corrected as shown below:

Col. 9,  line 14, change "plot" to --plots--;
         line 38, after "successively" insert --,--;
         line 39, delete "as" (first occurrence);
         line 40, change "initialized" to --initializes--;
         line 67, change "provides" to --provide--.

Col. 10, line 34, after "resistor" insert --,--;
         line 35, delete "form";
         line 66, after "counter" insert --("T-CNTR")--.

Col. 11, line 25, after "sampling" insert --an--;
         line 42, delete "and";
         line 44, after "signal;" insert --and--;
         line 56, change "signal sin" to --signals in--.

Col. 12, line 2, change "conversions" to --conversion--;
         line 40, after "controlled" insert --,--;
         line 44, after "with" insert --a--.

Col. 14, line 26, change "for" to --from--.

Signed and Sealed this

Eighteenth Day of October, 1994

Attest:

BRUCE LEHMAN

*Attesting Officer*     *Commissioner of Patents and Trademarks*